US006495398B1

(12) United States Patent
Goetz

(10) Patent No.: US 6,495,398 B1
(45) Date of Patent: Dec. 17, 2002

(54) WAFER-SCALE PACKAGE FOR SURFACE ACOUSTIC WAVE CIRCUIT AND METHOD OF MANUFACTURING THE SAME

(75) Inventor: Martin Goetz, Dallas, TX (US)

(73) Assignee: Clarisay, Incorporated, Dallas, TX (US)

( * ) Notice: Subject to any disclaimer, the term of this patent is extended or adjusted under 35 U.S.C. 154(b) by 10 days.

(21) Appl. No.: 09/755,018

(22) Filed: Jan. 5, 2001

(51) Int. Cl.[7] .............................................. H01L 41/04
(52) U.S. Cl. ....................................... 438/117; 438/118
(58) Field of Search ........................ 438/117; 75/517 R; 174/260, 52.3; 29/832; 257/698; 310/313 B, 313; 333/193; H03H 9/25

(56) References Cited

U.S. PATENT DOCUMENTS

| 4,920,801 A | * | 5/1990 | Church ..................... 73/517 R |
| 5,235,135 A | * | 8/1993 | Knecht et al. ............. 174/52.3 |
| 5,345,134 A | * | 9/1994 | Greer ......................... 310/313 |
| 5,699,027 A | * | 12/1997 | Tsuji et al. .................. 333/193 |
| 5,896,636 A | * | 4/1999 | Penunuri .................... 29/25.35 |
| 5,917,265 A | * | 6/1999 | Naumenko et al. ......... 310/313 |
| 5,952,765 A | * | 9/1999 | Garber et al. ........... 310/313 B |
| 6,114,635 A | * | 9/2000 | Lakin et al. ................. 174/260 |
| 6,225,692 B1 | * | 5/2001 | Hinds ......................... 257/698 |
| 6,321,444 B1 | * | 11/2001 | Yatsuda et al. ............... 29/832 |

FOREIGN PATENT DOCUMENTS

JP        08032402 A  *  2/1996  ............ H03H/9/25

* cited by examiner

Primary Examiner—Hoai Ho
Assistant Examiner—Thinh Nguyen

(57) ABSTRACT

A surface acoustic wave (SAW) circuit package and a method of fabricating the package. In one embodiment, the package includes: (1) a substantially planar piezoelectric substrate, (2) SAW circuit conductors located over the substrate, (3) sidewalls connected to, and extending from a plane of the substrate and surrounding the SAW conductors and (4) a lid connected to the sidewalls, the substrate, sidewalls and lid cooperating to form a hermetic enclosure for the SAW conductors.

20 Claims, 5 Drawing Sheets under the USC 6,495,398 B1

WAFER-SCALE PACKAGE FOR SURFACE ACOUSTIC WAVE CIRCUIT AND METHOD OF MANUFACTURING THE SAME

TECHNICAL FIELD OF THE INVENTION

The present invention is directed, in general, to surface acoustic wave (SAW) circuits and, more specifically, to a wafer-scale package for a SAW circuit and method of manufacturing such wafer-scale package therefor.

BACKGROUND OF THE INVENTION

Surface acoustic wave (SAW) devices for use in electronic signal processing have been advantageously adopted by the electronics industry. Such SAW devices have several advantages over more conventional technologies. They can be designed to provide complex signal processing in a single unit, and they also offer an additional benefit from their ability to be mass produced using semiconductor microfabrication techniques. These techniques lead to lower-cost devices having only small operating characteristic variations from unit to unit. Since SAW devices may be implemented in rugged, light-weight and power-efficient modules, they find many important applications, especially in mobile, wireless and spaceborne communication systems. Such communication systems typically operate over a wide range of frequencies from about 10 megahertz to about two gigahertz. The specific signal processing capabilities and frequency range of SAW devices may be determined to allow SAW devices to perform several roles in electronic systems.

An important feature of the SAW device is its geometry, which incorporates two metal patterns having interdigitated conductive lines or traces. Such interdigitated metal structures are formed on a piezoelectric substrate and act as input and output signal paths when an AC signal voltage is applied to one of the metal structures. This AC voltage induces a surface acoustic wave in the underlying substrate wherein the acoustic wave propagates to the output structure. The interdigitated metal lines of the signal receiving portion detect the acoustic wave and convert it into a filtered electrical output signal. SAW devices, operating in the Rayleigh wave mode, can generally be designed to provide bandpass filters that achieve responses that would otherwise require several hundred inductors and capacitors in conventional LC filter designs. Proper operation and containment of the acoustic waves require precise construction of both the central and outlying regions.

Turning briefly to FIG. 1, illustrated is a diagram of a conventional packaged SAW device 100. As illustrated, the packaged SAW device 100 includes interdigitated metal structures 110 and a piezoelectric substrate 120, both of which are manufactured on a wafer substrate 130. Formed over the interdigitated metal structures 110 and the piezoelectric substrate 120, and contacting the wafer substrate 130, is a hermetic enclosure 140. It is common for the hermetic enclosure 140 to have a substantially larger footprint than the footprint of the piezoelectric substrate 120. An aspect ratio of 6 to 1, representing a ratio of the footprint of the hermetic enclosure to the footprint of the piezoelectric substrate, is not uncommon in today's electronics industry. Packaging the Prior Art SAW devices 100 as shown in FIG. 1 has become well accepted, unfortunately, the outermost footprint of the packaged SAW device 100 is larger than currently desired in the electronics industry, particularly the wireless telephone industry.

Accordingly, what is needed in the art is a method of packaging SAW devices that does not experience the space limitations experienced in the prior art methods.

SUMMARY OF THE INVENTION

To address the above-discussed deficiencies of the prior art, the present invention provides a SAW circuit package and a method of fabricating the package. In one embodiment, the package includes: (1) a substantially planar piezoelectric substrate, (2) SAW circuit conductors located over the substrate, (3) sidewalls connected to, and extending from a plane of the substrate and surrounding the SAW conductors and (4) a lid connected to the sidewalls, the substrate, sidewalls and lid cooperating to form a hermetic enclosure for the SAW conductors.

The present invention therefore introduces packages for SAW circuits that substantially reduce the footprint of prior SAW packages. The smaller footprint allows more SAW circuits to be employed in a given piece of equipment (such as a wireless telephone), or allows a piece of equipment having the same number of SAW circuits to be much smaller.

In one embodiment of the present invention, the sidewalls and the lid are formed from a single piece of material. In an embodiment to be illustrated and described, the lid is a dicable part of a lid wafer and the sidewalls bound a recess formed in the lid wafer. The SAW circuit conductors reside within the recess and are hermetically protected from the elements by the lid and sidewalls.

In one embodiment of the present invention, the substrate comprises one selected from the group consisting of: (1) bismuth germanium oxide, (2) gallium arsenide, (3) lithium borate, (4) lithium niobate, (5) lithium tantalate, (6) langasite, (7) lead zirconium tantalate and (8) quartz. Those skilled in the pertinent art will understand that other currently-known and later-discovered materials may be suitable for use as a substrate, depending upon a particular application.

In one embodiment of the present invention, the lid comprises a plurality of vias containing metal, the metal contacting the SAW circuit conductors to form terminals therefor. In this embodiment, the lid actually becomes the mounting surface when the package is mounted to a circuit board. Of course, the vias (and resulting terminals) may extend through the substrate or the sidewalls, as may be advantageous to a particular application.

In one embodiment of the present invention, footprints of the substrate and the lid are coextensive. This allows the package to occupy no more circuit board "real estate" than the bare substrate itself, which is distinctly advantageous. Those skilled in the art will recognize, however, that such is not necessary to remain within the broad scope of the present invention.

In one embodiment of the present invention, the lid comprises one selected from the group consisting of: (1) ceramic and (2) silicon. Those skilled in the pertinent art will understand that other currently-known and later-discovered materials may be suitable for use as a lid, depending upon a particular application.

In one embodiment of the present invention, the SAW circuit conductors cooperate to form multiple SAW resonators. Thus, more than one SAW resonator may be included in a single package. This is advantageous when a unitary filter network is desired. Of course, this need not be the case.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
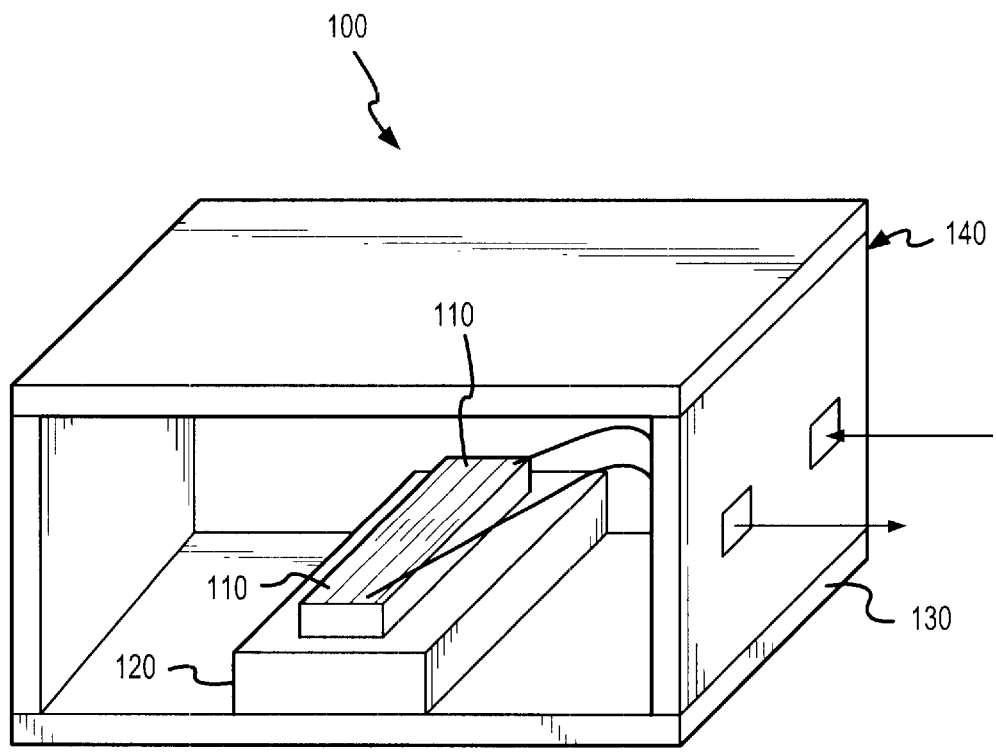
FIG. 1 illustrates a diagram of a conventional packaged SAW device.
Figure 2:
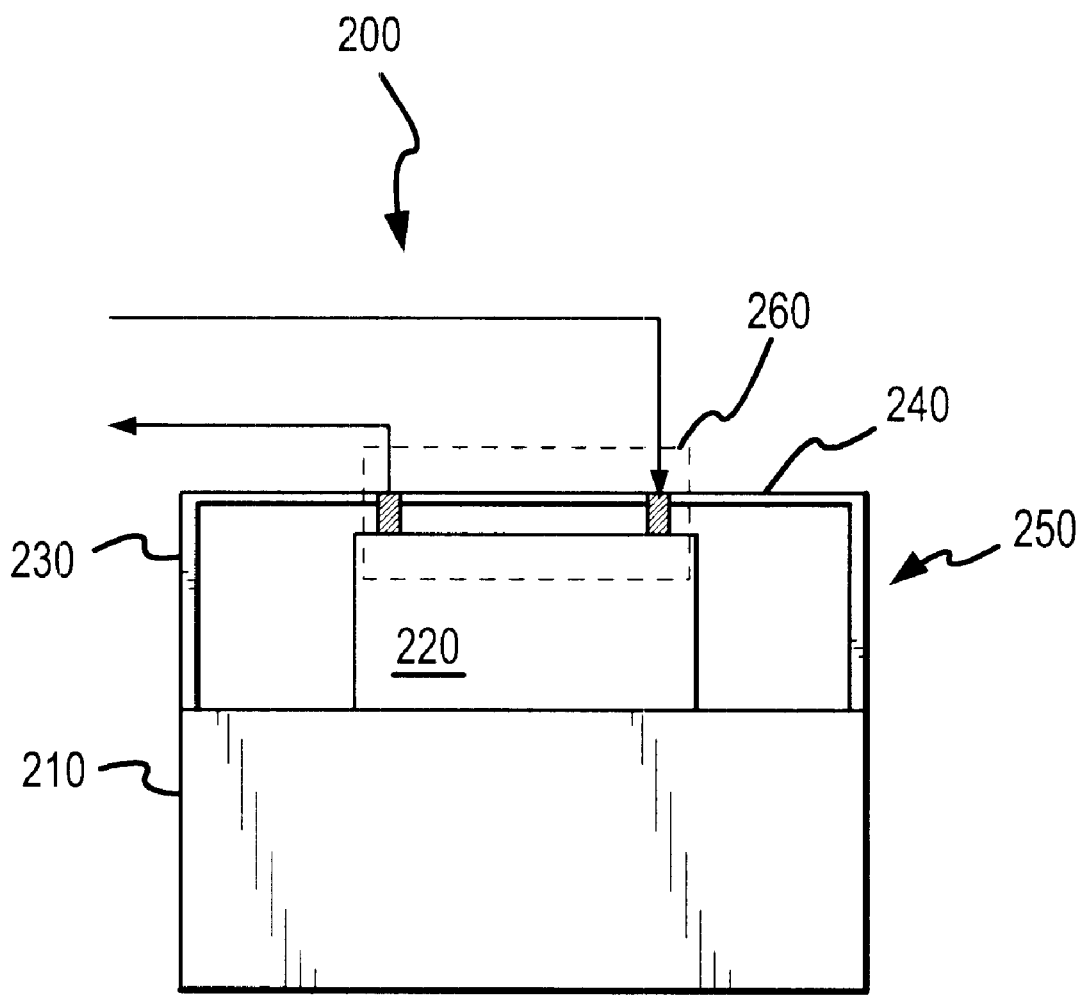
FIG. 2 illustrates a block diagram of a surface acoustic wave (SAW) circuit package constructed according to the principles of the present invention.

Referring initially to FIG. 2, illustrated is a block diagram of a surface acoustic wave (SAW) circuit package 200 constructed according to the principles of the present invention. The SAW circuit package 200 includes a substantially planar piezoelectric substrate 210, and SAW circuit conductors 220 located over the substrate 210. The SAW circuit package 200 further includes sidewalls 230 connected to, and extending from a plane of the substrate 210, wherein the sidewalls 230 surround the SAW circuit conductors 220. Additionally, the SAW circuit package 200 includes a lid 240 connected to the sidewalls 230, the sidewalls 230, lid 240, and substrate 210 forming a hermetic enclosure 250 for the SAW circuit conductors 220. The hermetic enclosure 250 advantageously isolates the SAW circuit conductors 220 from environmental contaminants and damage that might harm their operation. In the embodiment shown in FIG. 2, the lid 240 further contains a plurality of vias 260 containing metal, wherein the vias 260 contact the SAW circuit conductors 220 to form terminals.

In contrast to prior art SAW devices, the SAW circuit package 200 uses the substantially planar piezoelectric substrate 210 as one surface of the hermetic enclosure 250. As a result, a footprint of the SAW circuit package is substantially smaller than the footprint of prior are SAW devices. Furthermore, the smaller footprint allows more SAW circuits to be employed in a given piece of equipment (such as a wireless telephone), or further allows a piece of equipment having the same number of SAW circuits to be much smaller. Similarly, reducing the number of required elements in the SAW circuit package, mainly the conventional wafer substrate, reduces the number of elements from which reliability issues may arise.

Figure 3:
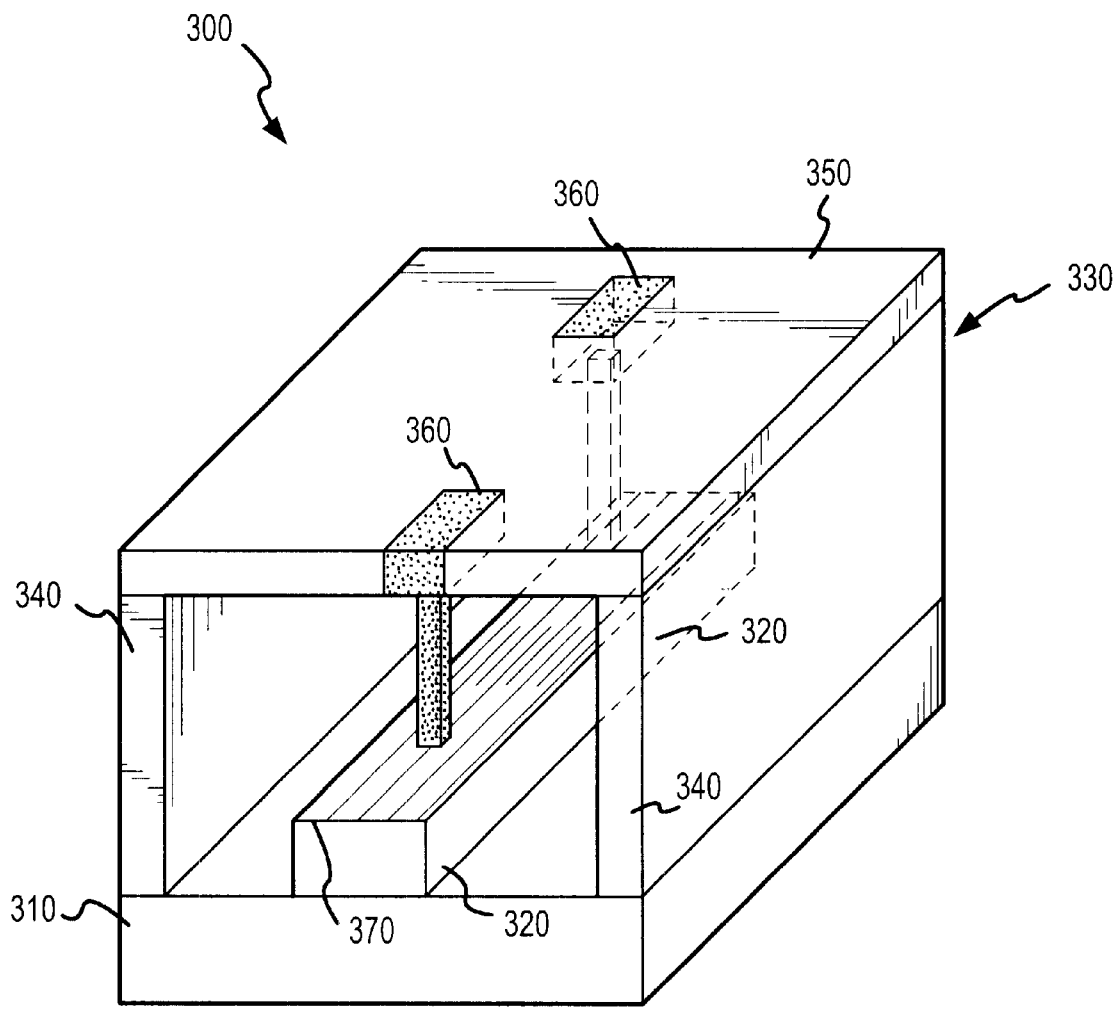
FIG. 3 illustrates a diagram of an embodiment of a SAW circuit package constructed according to the principles of the present invention.

Turning now to FIG. 3, illustrated is a diagram of an embodiment of a SAW circuit package 300 constructed according to the principles of the present invention. The SAW circuit package 300 includes a substantially planar piezoelectric substrate 310 having SAW circuit conductors 320, collectively acting as a SAW resonator, formed thereover. The substantially planar piezoelectric substrate 310 may comprise many known or hereinafter discovered piezoelectric materials, however, in one advantageous embodiment of the present invention, the substantially planar piezoelectric substrate 310 comprises a material selected from the group consisting of bismuth germanium oxide, gallium arsenide, lithium borate, lithium niobate, lithium tantalate, langasite, lead zirconium tantalate, or quartz.

As illustrated in FIG. 3, the SAW circuit package 300 further includes a hermetic enclosure 330. In the embodiment illustrated in FIG. 3, the hermetic enclosure 330 consists essentially of sidewalls 340, a lid 350 and the substantially planar piezoelectric substrate 310. The sidewalls 340 extend from a plane of the substantially planar piezoelectric substrate 310 and connect thereto. The lid 350 is further connected to the sidewalls 340, completing the hermetic enclosure 330. The sidewalls 340 and lid 350 may comprise any material generally known or hereafter discovered for use as a hermetic enclosure. For example, in an exemplary embodiment, the sidewalls 340 and lid 350 may comprise bismuth germanium oxide, gallium arsenide, lithium borate, lithium niobate, lithium tantalate, langasite, lead zirconium tantalate, quartz, ceramic, silicon, Pyrex, or any other similar material. As illustrated in FIG. 3, footprints of the substantially planar piezoelectric substrate 310 and the lid 350, are substantially coextensive. This allows the SAW circuit package 300 to occupy no more circuit board "real estate" than the bare substantially planar piezoelectric substrate 310 itself. This provides an important advantage over the prior art SAW devices, especially in view of the electronic industries' move toward more compact devices.

In the embodiment illustrated in FIG. 3, the SAW circuit package 300 further includes a plurality of vias 360 formed within the lid 350. The vias 360 contact the SAW circuit conductors 320, forming terminals therefor. In an exemplary embodiment of the invention, the vias 360 comprise a conductive metal, such as aluminum, copper, gold or any other known or hereinafter discovered conductive material. The vias 360 may be formed within the lid 350 after assembling the lid 350 with the sidewalls 340, however, in one advantageous embodiment, the vias 360 are formed within the lid 350 during manufacture thereof. In such an instance, the vias 360 would be precisely designed to accurately contact the SAW circuit conductors 320 when assembled. In embodiments where the vias 360 are located within the lid 350, as illustrated in FIG. 3, the lid 350 may actually become a mounting surface when the SAW circuit package 300 is mounted to a circuit board. The lid 350 may further contain other devices located thereon, such as surface mount pads.

In an alternative embodiment of the invention, the vias 360 may be located at an edge 370 of the saw circuit conductors 320. In such a situation, a single via 360 could be manufactured to contact two adjacent saw circuit conductors 320. The single via could then be divided into two via structures by any known process, resulting in two via structures being manufactured using only a single via etching or drilling step. This may be used to save substantial time and money during manufacturing the SAW circuit package 200.

Figure 4:
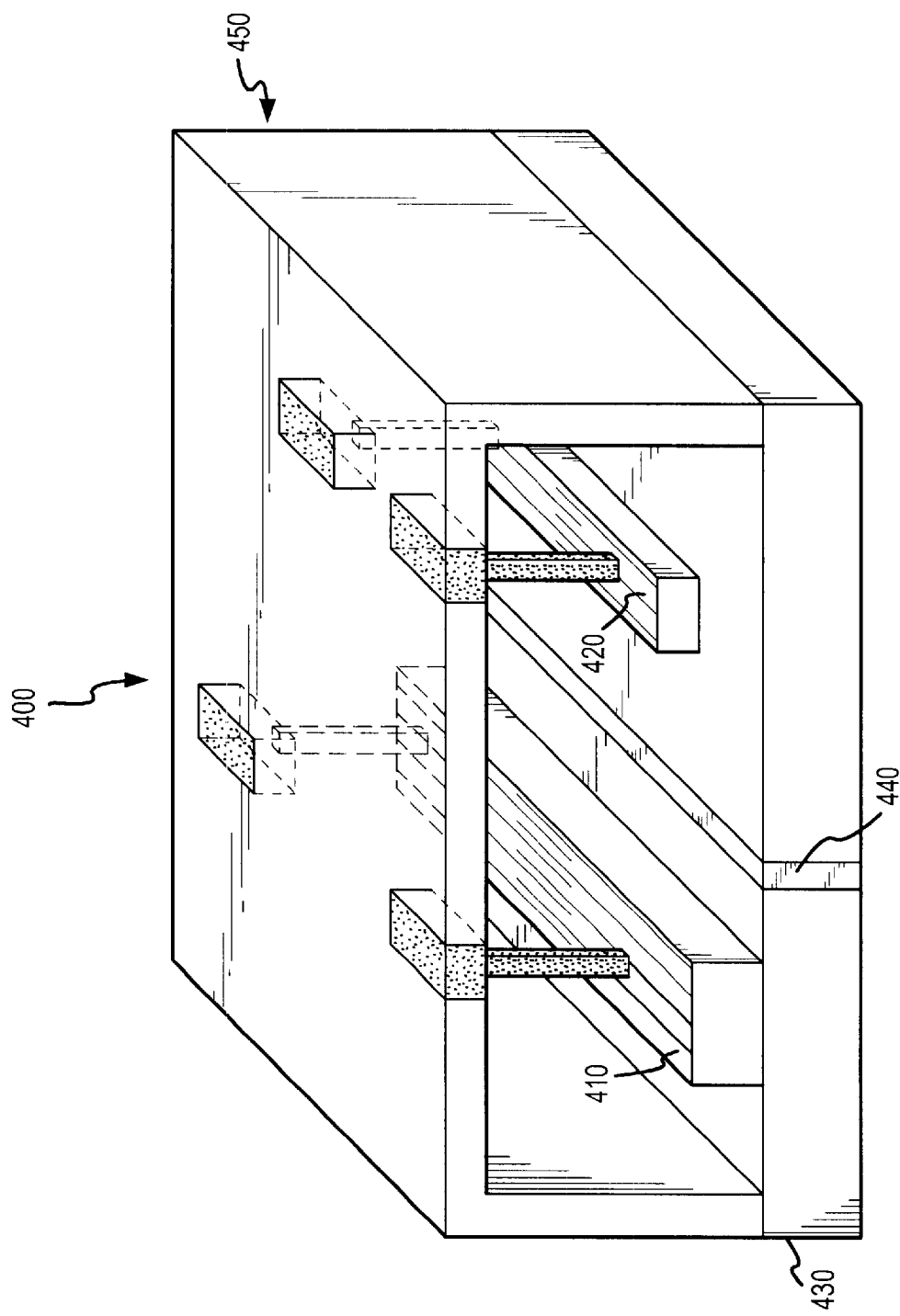
FIG. 4 illustrates a sectioned view of a SAW circuit package showing an alternative embodiment of the present invention.

Turning now to FIG. 4, illustrated is a sectioned view of a SAW circuit package 400 showing an alternative embodiment of the present invention. The embodiment of the SAW circuit package 400 illustrated in FIG. 4 includes a first set of SAW circuit conductors 410 and a second set of SAW circuit conductors 420, both of which are formed over a common substantially planar piezoelectric substrate 430. As illustrated, the common piezoelectric substrate 430 includes a crosstalk shield 440 located therein, and between the first and second sets of SAW circuit conductors 410, 420. The crosstalk shield 440 provides a signal isolation barrier between the first and second sets of SAW circuits conductors 410, 420. The crosstalk shield 440 prevents signals within each of the first and second sets of SAW circuits conductors 410, 420 from interfering with the other, since they are in close proximity and share the substantially planar common piezoelectric substrate 430. In an exemplary embodiment, the signal isolation is achieved by connecting the crosstalk shield 440 to ground.

As further illustrated in FIG. 4, the sidewalls 340 and lid 350 (FIG. 3) may be formed from a single piece of enclosure material 450. This may be quite advantageous because it may eliminate the need to provide a hermetic seal between the sidewalls 340 and lid 350 (FIG. 3). As with many manufacturing processes, eliminating manufacturing steps also tends to reduce reliability issues.

Figure 5:
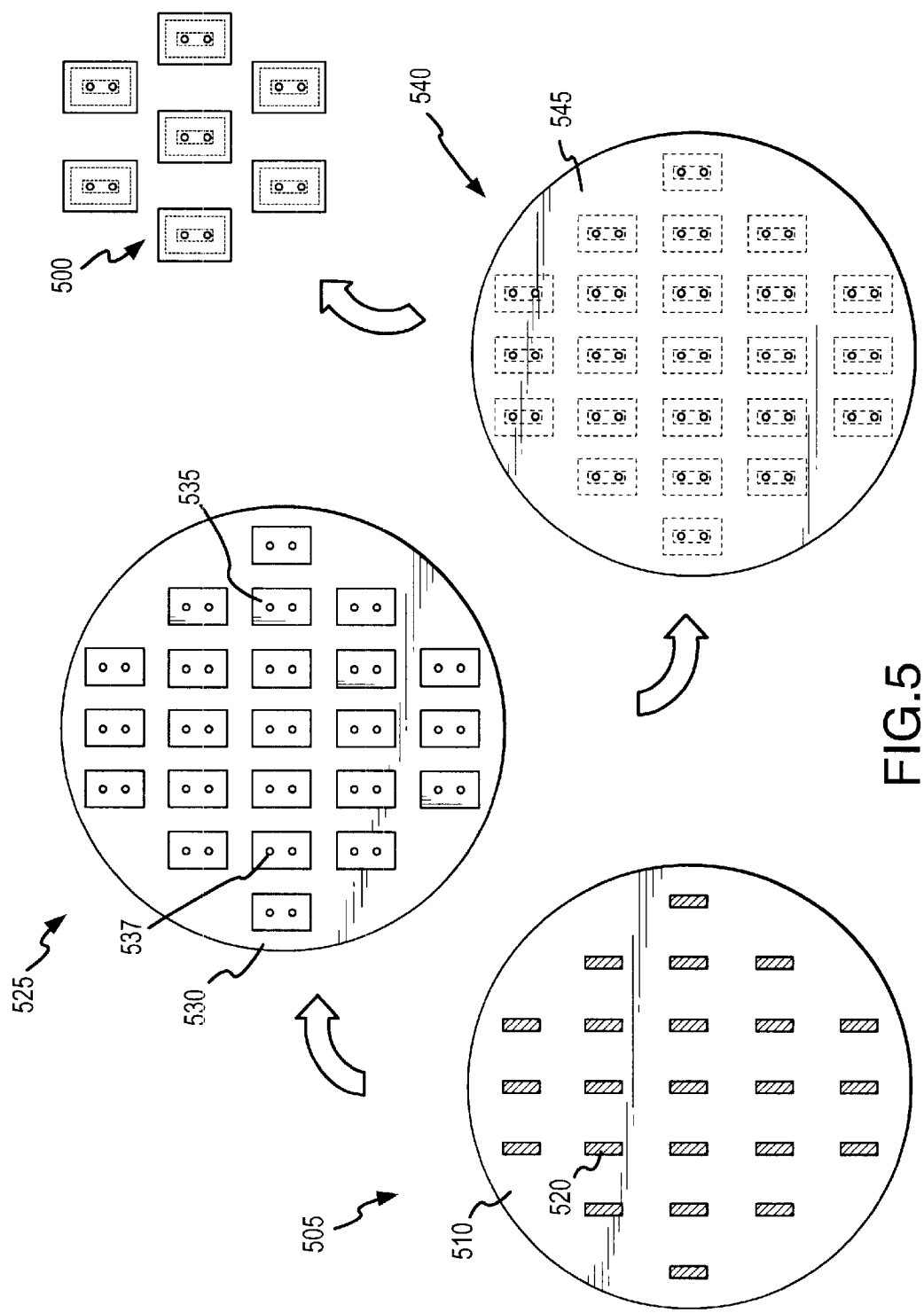
FIG. 5 illustrates a method of manufacturing an embodiment of a SAW circuit package, which in the present embodiment may be similar to the SAW circuit package illustrated in FIG. 4.

Turning to FIG. 5, illustrated is a method of manufacturing an embodiment of a SAW circuit package 500, which in the present embodiment may be similar to the SAW circuit package 400 illustrated in FIG. 4. In a first manufacturing step 505, a substantially planar piezoelectric wafer 510, such as a 4-inch piezoelectric wafer, is provided. The substantially planar piezoelectric wafer 510 may comprise many known or hereinafter discovered piezoelectric materials, however, in one advantageous embodiment of the present invention, the substantially planar piezoelectric substrate 310 comprises a material selected from the group consisting of bismuth germanium oxide, gallium arsenide, lithium borate, lithium niobate, lithium tantalate, langasite, lead zirconium tantalate, or quartz.

Subsequent to providing the substantially planar piezoelectric wafer 510, a plurality of SAW circuit conductors may be formed over the substantially planar piezoelectric wafer 510, forming a plurality of SAW resonators 520. One skilled in the art understands how to form the SAW resonators 520, and further understands that any known or hereafter discovered process for forming the SAW resonators 520 is within the scope of the present invention.

In a second manufacturing step 525, a lid wafer 530 should also be provided. The lid wafer 530 includes a plurality of recesses 535 formed therein, and corresponding to the plurality of SAW resonators 520 located on the wafer. In an exemplary embodiment of the invention, the lid wafer 530 comprises a material that is CTE compatible, easily etchable and non-conductive, such as a silicon or ceramic lid wafer. It should be noted, however, that any other similar hermetic material may comprise the lid wafer 530. The lid wafer 530, as illustrated, may include a plurality of vias 537 containing metal. The plurality of vias 537 are configured to contact the plurality of SAW resonators 520, once assembled.

In a third manufacturing step 540, the lid wafer 530 should be bonded to the substantially planar piezoelectric wafer 510, forming a SAW wafer assembly 545. In the illustrative embodiment shown in FIG. 5, the lid wafer 530 is flipped and bonded to the substantially planar piezoelectric wafer 510, wherein the plurality of recesses of the lid wafer 530 correspond with the plurality of SAW resonators 520 located on the substantially planar piezoelectric wafer 510. As such, the lid water 530 is bonded to the substantially planar piezoelectric wafer 510, forming a hermetic enclosure for the plurality of SAW resonators 520.

The lid wafer 530 may be bonded to the substantially planar piezoelectric wafer 510 using many techniques, including techniques using epoxy, heat, pressure, or any other compatible process parameter. In an exemplary embodiment of the invention, a direct hetero-bonding of the substantially planar piezoelectric wafer 510 with the lid wafer 530, may be conducted. Direct hetero-bonding uses the intermolecular forces of hydrokysils, which attach onto the two surfaces to provide an initial bond there between. In a subsequent low temperature anneal the hydrogen gradually diffuses out of the interface, the diffusion causing the intermolecular force bonding of hydrokysils to change to a chemical bonding of oxygen and component atoms of the substrates. In such a situation, the chemical bond is substantially stronger than the intermolecular bond. A more detailed discussion of applicable bonding techniques may be found in *Silicon Wafer Bonding for MEMS Manufacturing,* by A. A. Ayon, Solid State Technology, August, 1999 (Vol. 42, Issue 8), which is also incorporated herein by reference.

In a final manufacturing step 550, the SAW wafer assembly 545 may be separated into the individual SAW circuit packages 500. In an exemplary embodiment, the SAW wafer assembly 545 may be separated into the individual SAW circuit packages 500 using wafer dicing, however, one skilled in the art understands that any compatible separation technique may be used.

In summary, the present invention introduces the novel concept of a SAW circuit package, wherein a piezoelectric substrate performs like one surface of a hermetic enclosure 250. Since the present invention is capable of using the piezoelectric substrate as one surface of the hermetic enclosure, the traditional wafer substrate may be eliminated, resulting in a SAW circuit package footprint substantially smaller than a footprint of prior are SAW devices. In an exemplary embodiment, an aspect ratio approaching about 1 to 1, representing a ratio of the footprint of the hermetic enclosure to the footprint of the piezoelectric substrate, is achievable. The smaller footprint allows more SAW circuit packages to be employed in a given piece of equipment (such as a wireless telephone), or further allows a piece of equipment having the same number of SAW circuit packages to be much smaller.

Although the present invention has been described in detail, those skilled in the art should understand that they can make various changes, substitutions and alterations herein without departing from the spirit and scope of the invention in its broadest form.

What is claimed is:

1. A surface acoustic wave (SAW) circuit package, comprising:

a substantially planar piezoelectric substrate;

SAW circuit conductors located over said substrate;

sidewalls connected to, and extending from a plane of said substrate and surrounding said SAW conductors;

a lid; and an adhesive connecting said sidewalls to said lid and substrate to form a hermetic enclosure for said SAW conductors.

2. The package as recited in claim 1 wherein said sidewalls and said lid are formed from a single piece of material.

3. The package as recited in claim 1 wherein said substrate comprises one selected from the group consisting of:
   bismuth germanium oxide,
   gallium arsenide,
   lithium borate,
   lithium niobate,
   lithium tantalate,
   langasite,
   lead zirconium tantalate, and
   quartz.

4. The package as recited in claim 1 wherein said lid comprises a plurality of vias containing metal, said metal contacting said SAW circuit conductors to form terminals therefor.

5. The package as recited in claim 1 wherein footprints of said substrate and said lid are coextensive.

6. The package as recited in claim 1 wherein said lid comprises one selected from the group consisting of:
   ceramic, and
   silicon.

7. The package as recited in claim 1 wherein said SAW circuit conductors cooperate to form multiple SAW resonators.

8. A method of manufacturing a surface acoustic wave (SAW) circuit package, comprising:
   creating a substantially planar piezoelectric substrate;
   forming SAW circuit conductors over said substrate;
   connecting sidewalls to said substrate with an adhesive, said sidewalls extending from a plane of said substrate and surrounding said SAW conductors; and
   connecting a lid to said sidewalls with said adhesive, said substrate, sidewalls and lid cooperating to form a hermetic enclosure for said SAW conductors.

9. The method as recited in claim 8 further comprising forming said sidewalls and said lid from a single piece of material.

10. The method as recited in claim 8 wherein said substrate comprises one selected from the group consisting of:
    bismuth germanium oxide,
    gallium arsenide,
    lithium borate,
    lithium niobate,
    lithium tantalate,
    langasite,
    lead zirconium tantalate, and
    quartz.

11. The method as recited in claim 8 further comprising:
    forming a plurality of vias in said lid; and
    depositing metal in said vias, said metal contacting said SAW circuit conductors to form terminals therefor.

12. The method as recited in claim 8 wherein footprints of said substrate and said lid are coextensive.

13. The method as recited in claim 8 wherein said lid comprises one selected from the group consisting of:
    ceramic, and
    silicon.

14. The method as recited in claim 8 wherein said SAW circuit conductors cooperate to form multiple SAW resonators.

15. A surface acoustic wave (SAW) circuit package, comprising:
    a substantially planar piezoelectric substrate having a first footprint;
    SAW circuit conductors located over said substrate;
    sidewalls connected to, and extending from a plane of said substrate and surrounding said SAW conductors;
    a lid having a second footprint coextensive with said first footprint, said lid including a plurality of vias containing metal, said metal contacting said SAW circuit conductors to form terminals therefor; and
    an adhesive connecting said sidewalls to said substrate and lid, whereby said substrate, sidewalls and lid cooperate to form a hermetic enclosure for said SAW conductors.

16. The package as recited in claim 15 wherein said sidewalls and said lid are formed from a single piece of material.

17. The package as recited in claim 15 wherein said substrate comprises one selected from the group consisting of:
    bismuth germanium oxide,
    gallium arsenide,
    lithium borate,
    lithium niobate,
    lithium tantalate,
    langasite,
    lead zirconium tantalate, and
    quartz.

18. The package as recited in claim 15 wherein said lid comprises one selected from the group consisting of:
    ceramic, and
    silicon.

19. The package as recited in claim 15 wherein said SAW circuit conductors cooperate to form multiple SAW resonators.

20. A surface acoustic wave (SAW) wafer assembly, comprising:
    a substantially planar piezoelectric wafer;
    a plurality of SAW circuit conductors located over said wafer and forming a plurality of SAW resonators therewith; and
    a lid wafer comprising a plurality of recesses corresponding to said plurality of SAW resonators, said lid wafer bonded to said wafer to form hermetic enclosures for said plurality of SAW circuit conductors.

* * * * *